(12) United States Patent
Deleonibus et al.

(10) Patent No.: US 6,346,450 B1
(45) Date of Patent: Feb. 12, 2002

(54) PROCESS FOR MANUFACTURING MIS TRANSISTOR WITH SELF-ALIGNED METAL GRID

(75) Inventors: Simon Deleonibus, La Chanteraie; François Martin, Grenoble, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/319,915

(22) PCT Filed: Dec. 15, 1997

(86) PCT No.: PCT/FR97/02300

§ 371 Date: Jun. 28, 1999

§ 102(e) Date: Jun. 28, 1999

(87) PCT Pub. No.: WO98/27582

PCT Pub. Date: Jun. 25, 1998

(30) Foreign Application Priority Data

Dec. 16, 1996 (FR) ............................. 96 15436

(51) Int. Cl.$^7$ ............................. H01L 21/336
(52) U.S. Cl. .................. 438/305; 438/199; 438/279; 438/286; 438/183; 438/299
(58) Field of Search ................. 438/275, 279, 438/286, 182, 183, 290, 299, 301, 303, 305, 306, 592, 199, 229, 230

(56) References Cited

U.S. PATENT DOCUMENTS 5,391,510 A * 2/1995 Hsu et al. ............... 438/301
5,960,270 A * 9/1999 Misra et al. ............. 438/197

OTHER PUBLICATIONS

M. Sawada, et al., Extended Abstracts of the 1993 International Conference on Solid State Devices and Materials, pp. 1083–1085, "A Newly Developed Two Mode Channel FET (TMT) Suited for Super–Low–Noise and High–Power Applications", 1993.

* cited by examiner

Primary Examiner—Charles Bowers
Assistant Examiner—Jack Chen
(74) Attorney, Agent, or Firm—Oblon, Spivak, McClelland, Maier & Neustadt, P.C.

(57) ABSTRACT

This invention relates to a MIS transistor and its manufacturing process. The process comprises the following steps:
  a) production of a dummy grid on a substrate, made of a material capable of resisting heat treatment,
  b) formation of self-aligned source and drain regions on the dummy grid, in the substrate,
  c) lateral coating of the dummy grid with an electrically insulating layer,
  d) elimination of the dummy grid and formation of a final grid made of a material with low resistivity, in the same position as the dummy grid.

Application to the manufacture of hyper-frequency circuits.

22 Claims, 9 Drawing Sheets

PROCESS FOR MANUFACTURING MIS TRANSISTOR WITH SELF-ALIGNED METAL GRID

DESCRIPTION

1. Technical field

This invention relates to a MIS transistor with self-aligned grid and its manufacturing process. A MIS transistor is a transistor with a Metal-Insulator-Semiconductor type structure, for example such as MOS (Metal-Oxide-Semiconductor) transistors.

The invention is more particularly applicable to the manufacture of such transistors capable of operating in the hyper-frequency range, on a silicon substrate.

The invention is used for microelectronics applications for the manufacture of hyper-frequency and/or power circuits, for example for the production of circuits that can be used in the telecommunications field.

2. State of prior art

According to known art, hyper-frequency type components and circuits are made on gallium arsenide (AsGa) substrates, or on silicon (Si) substrates.

For cost reasons, circuits made on gallium arsenide substrates are usually not particularly complex and do not have a high integration density. Consequently the architecture of these circuits is not optimized for their compactness.

For example document (1), the reference of which is given at the end of this description, contains information about the production of hyper-frequency components on an AsGa substrate.

Furthermore, FIG. 1 attached also contains an example of a hyper-frequency component, in fact a MOS (Metal Oxide Semiconductor) transistor made on a silicon substrate.

The transistor in FIG. 1 comprises a source region 10, a channel region 12 and a drain region 14 defined in a silicon substrate 16. For example, the source and the drain are formed by implantation of n type or p type doping impurities and form regions with lower resistivity.

An insulating silicon oxide layer 18 is formed on the surface of substrate 16 and covers the source, channel and drain regions.

A non-through opening 20 is formed by etching in the oxide layer 18 approximately vertically in line with the channel region 12. A thin oxide layer 22 at the bottom of opening 20 forms a grid insulation. Finally, a grid 24 is formed in the opening 20.

The material in which the grid is formed, actually metal, has a low resistivity and thus enables high frequency operation of the resulting transistor.

The integration density of devices made according to FIG. 1 depends on the precision with which the opening 20, and then the grid 24, are aligned with respect to the channel 12 and the source and drain regions 10 and 14. This precision depends directly on the quality of manufacturing tools (particularly for alignment) used to make the semiconductor devices.

In a known manner, one way of increasing the compactness and integration density of circuits in order to make integrated circuits with MOS transistors on a silicon substrate, is to self-align the grid with respect to the source and drain regions.

It is assumed that the grid is self-aligned with respect to source and drain areas when the relative position of the grid and the source and drain areas are directly defined by the position of the grid itself, rather than being the result of an alignment of the means used (for example masks) to make these parts. In practice, self-alignment of the grid with respect to the source and drain regions is the result of a manufacturing process for the source and drain regions in which these regions are formed by implantation of impurities in the substrate using the grid, made earlier, as the implantation mask. The grid location thus precisely and automatically fixes the position of the source of the channel and the drain.

The processes for the formation of transistors with a grid self-aligned with the source and drain areas usually required a heat treatment carried out at high temperature. For example, in processes for making MOS on silicon transistors with a self-aligned grid, a heat treatment at a temperature of the order of 750° C. or more is carried out after implantation of impurities, in order to activate the source and drain areas.

Furthermore a densification or creep of the insulation placed between the grid and the first metal interconnection level is done within an approximately identical temperature range.

Furthermore, as mentioned above, a grid material with a low resistivity has to be used so that the transistor can operate at high frequency. For guidance, when hyper-frequency type devices are being made, in other words devices that usually operate at a frequency exceeding 36 MHz, the grid material used to make the transistors must preferably have a resistivity of between about 1 and 10 $\mu\Omega$·cm.

In fact, materials with a resistivity within the given range are incapable of resisting the temperatures of the heat treatments applied in the processes described for manufacturing transistors with self-aligned grid. In particular, these materials are not capable of resisting temperatures equal to or exceeding 750° C.

One material frequently used for making the grid for transistors with a self-aligned grid is polycrystalline silicon (poly Si). Polycrystalline silicon is capable of resisting the temperatures of heat treatments used when these transistors are being formed.

However, the resistivity of polycrystalline silicon is of the order of $10^3 \mu\Omega$·cm, which is not compatible with envisaged applications of transistors in the hyper-frequency range. Furthermore, we do not know how to sufficiently reduce the resistivity of polycrystalline silicon so that transistors can operate in hyper-frequency.

Consequently, one purpose of this invention is to suggest a process for manufacturing MIS transistors with self-aligned grid, source and drain, and capable of operating within the hyper-frequency range.

Another purpose of the invention is to propose a process for manufacturing a compact transistor with interconnections in order to reduce the clearance of contacts with respect to the edge of grid conductors or interconnections.

Another purpose of the invention is to increase the integration density of the interconnections in a circuit comprising transistors with self-aligned grid, source and drain.

Another purpose of the invention is to propose a transistor designed to have a very high cutoff frequency.

Another purpose of the invention is to propose transistors compatible with the production of CMOS (complementary MOS) circuits with a high integration density.

DESCRIPTION OF THE INVENTION

More precisely, the purpose of the invention is a process for manufacturing MIS (Metal-Insulator-Semiconductor)

transistors on a semiconductor substrate. The process is defined by claim 1. Another purpose of the invention is a MOS transistor such as that defined in claim 23.

The dummy grid made during the process performs two functions; initially, it is used to define the location of the source and drain regions in step b) and then to define the location of the final transistor grid made from a material with low resistivity. The coating of the dummy grid on its lateral flanks, after this dummy grid has been eliminated, forms a "mold" for the final grid.

These characteristics guarantee automatic and perfectly precise alignment of the final grid with respect to the source and drain regions.

The final grid is formed from one or several materials. Each of these materials is chosen so as to have a low resistivity. For example, the resistivity of the materials may be chosen within a range varying from 1 to 10 $\mu\Omega$·cm.

According to one particular aspect of the invention, step a) may comprise:
  formation on the substrate of a stack comprising an oxide layer called the pedestal layer, a polycrystalline silicon layer and a silicon nitride layer in this order, and
  forming of the stack by etching to form the dummy grid with lateral flanks.

In this embodiment of the process, the dummy grid is composed of a thin silicon oxide layer, a polycrystalline or amorphous silicon layer, and then a silicon nitride layer, in this order.

The silicon nitride layer may be beneficially used to form the side coating of the dummy grid.

According to one particular aspect of the invention, step c) comprises:
  deposition of a first electrically insulating layer of silicon oxide doped with phosphorus and then a second layer of silicon oxide that is not intentionally doped, the first and the second layers coating the dummy grid, and,
  polishing of the first and second layers of silicon oxide, stopping on the dummy grid.

The silicon nitride layer included in the stack forming the dummy grid may advantageously be used to act as polishing stop layer.

According to another aspect of the invention, step b) may comprise:
  a first implantation of a low dose of doping impurities using the dummy grid as an implantation mask,
  the formation of spacers on the lateral flanks of the dummy grid,
  a second implantation of doping impurities with a dose higher than the dose of the first implantation, using the dummy grid equipped with spacers as the implantation mask.

Due to this double implantation, a "Low Doped Drain" (LDD) type of source and drain architecture, necessary for long life of the components, can be made.

For example, the lateral spacers on the flanks of the dummy grid may be formed by:
  an approximately conform deposit of a silicon oxide layer doped with phosphorus in order to coat the dummy grid, and,
  anisotropic etching of the said layer to eliminate it above the dummy grid while maintaining part of the said layer on the lateral flanks of the dummy grid, this part forming lateral spacers.

It is assumed that the deposit is conform when it matches the shape of the surface of the support on which it is made.

Due to the conform deposit of the layer of silicon oxide doped with phosphorus, this layer covers and is in contact not only on the lateral faces of the dummy grid, but also on the top of this grid. Anisotropic etching of the layer of silicon oxide doped with phosphorus can completely eliminate it on the top of the dummy grid while protecting the parts of the layer that will form the side spacers.

The transistor conform with the invention may be put in a circuit by connecting its terminals, formed by the source and drain regions and the grid, with other nearby components or transistors. Step b) in the process may also comprise silicidation of the source and drain regions in order to improve the quality of the contact between the interconnection lines used to form the circuit, and the source and drain regions. Silicidation is also self-aligned with respect to the dummy grid; it comprises a metal deposit which reacts by selectively forming an alloy (silicide) on exposed silicon areas.

According to one particular embodiment of step d) in the process, the process includes elimination by etching of silicon nitride and polycrystalline silicon layers in the dummy grid, the pedestal layer then forming an etching stop layer at the time of this etching.

The pedestal layer may also be eliminated in step d). In this case, a new insulating grid layer is formed before the final grid is made.

According to another specific aspect of the invention, step d) also includes partial etching of the first and second oxide layers before the formation of the final grid, in order to form a flare after the dummy grid has been eliminated.

The flare extends from the surface of the substrate and widens towards the upper surface of the first and second oxide layers.

Advantageously, the difference between the materials used to form the first and second layers is used beneficially to vary the etching speed on these layers. The flare can thus be configured to be in a particular shape. For example, the flare and particularly the final grid, may have a T-shaped cross-section.

Furthermore, step d) may also comprise partial elimination of the lateral spacers of the dummy grid. This elimination process, which can be done at the same time as the materials in the first and second oxide layers are etched, then contributes to shaping of the flare.

In one particular embodiment, manufacture of the final grid in step d) may include a successive and approximately conform deposit of a titanium nitride (TiN) layer and a tungsten (W) layer followed by flattening of these layers stopping on the electrical insulation layer. Due to the first layer of titanium nitride (TiN), it is guaranteed that there will be good bond of the tungsten (W) layer on a subjacent insulating grid layer. The grid insulation layer, for example made of silicon oxide, is preferably formed immediately before production of the final grid.

More generally, the material used in the final grid may advantageously by chosen with an extraction potential such that the Fermi level at equilibrium at the insulating transistor grid/channel interface are located at the mid-point of the prohibited band of the semiconductor.

The grid material may have a resistivity of between 1 $\mu\Omega$·cm and 10 $\mu\Omega$·cm, according to one advantageous example embodiment.

According to one particular aspect, the process according to the invention may also comprise the formation by doping of a channel region in the substrate before step a); the dummy grid being produced above the channel region.

Furthermore, the process may also be continued after step d) to include the following steps:

e) formation of contact points on the source and drain regions and on the grid, f) metallization of contact points.

Contact points formed on the grid and the source and drain regions are advantageously formed through a layer of insulating material deposited on the free surface of the structure obtained after polishing the first and second layers of silicon oxide (or BPSG).

According to one improvement of the invention, the process for manufacturing a transistor with an insulated grid from a material with low resistivity, as described above, may also include the formation of a transistor with a silicon grid.

In this case, the steps of the process may be continued to include:

step a) includes the formation of a stack on the substrate, comprising an oxide layer called the pedestal layer, a polycrystalline or amorphous silicon layer, and a silicon nitride layer in order and in at least one first region, and comprising an oxide layer called the pedestal layer, the polycrystalline or amorphous silicon layer, a layer of silicon oxide called an intermediate layer, and the silicon nitride layer, in at least one second region; and shaping of the stack by etching to produce the dummy grid with lateral flanks in the first region and at least one grid called a silicon grid in the second region, step b) includes the formation of a source region self-aligned on the dummy grid and a drain region self-aligned on the silicon grid region, step c) includes lateral coating of the dummy grid and the silicon grid with at least one electrically insulating material, step c) is preceded by elimination of silicon nitride layer on the silicon grid in the second region, elimination of the pedestal layer around the dummy grid and the silicon grid, and elimination of the intermediate silicon oxide layer, step d) includes formation of a protection layer covering the silicon grid while the dummy grid is being eliminated, in the second region.

Advantageously, layers or parts common to transistors with a low resistivity grid and a transistor with a silicon grid are made simultaneously in the first and second regions.

Although the description is limited essentially to the manufacture of a single transistor with a low resistivity grid (with a metal grid) and a single silicon grid transistor, it can be understood that the process is applicable to simultaneous production of several transistors of either of the two types mentioned.

According to one particular embodiment of the invention, after the pedestal layer and the intermediate layer have been eliminated and before step c) is carried out, a self-aligned silicidation of the source and drain regions, and the polycrystalline or amorphous silicon layer in the silicon grid, can be carried out.

Silicidation can improve the contact on the source, drain and grid regions.

Furthermore, a thin layer of silicon nitride may be placed on the silicided regions, and particularly the silicided source and drain regions, in order to protect them.

This operation is applicable to grid transistors with a grid made of a low resistivity material and silicon grid transistors. In the latter case, the silicon nitride layer is also in contact with the silicide formed in the polycrystalline or amorphous silicon layer in the grid.

Finally, according to one advantageous aspect of the process for concurrent manufacturing of the transistors with the two types of grid mentioned above, the lateral coating of the dummy grid and the silicon grid in step c) may comprise:

deposition as mentioned above of a first electrically insulating layer made of silicon oxide doped with phosphorus and then a second electrically insulating layer of silicon oxide not intentionally doped, the first and second layers coating the dummy grid and the silicon grid, and, polishing of the first and second silicon oxide layers stopping on the dummy grid, a thin layer of silicon oxide doped with phosphorus being kept on the polycrystalline or amorphous silicon layer of the silicon grid while this polishing is being done.

The main function of the thin layer of doped silicon oxide preserved on the layer of polycrystalline or amorphous silicon in the silicon grid is to protect the silicon grid when the silicon nitride layer on the dummy grid is being eliminated and when the dummy itself is being eliminated.

Other characteristics and advantages of the invention will become clear in the following description with reference to the figures in the attached drawings, given for purely illustrative and non-restrictive purposes.

DETAILED DESCRIPTION OF EMBODIMENTS OF THE INVENTION

Figure 2:
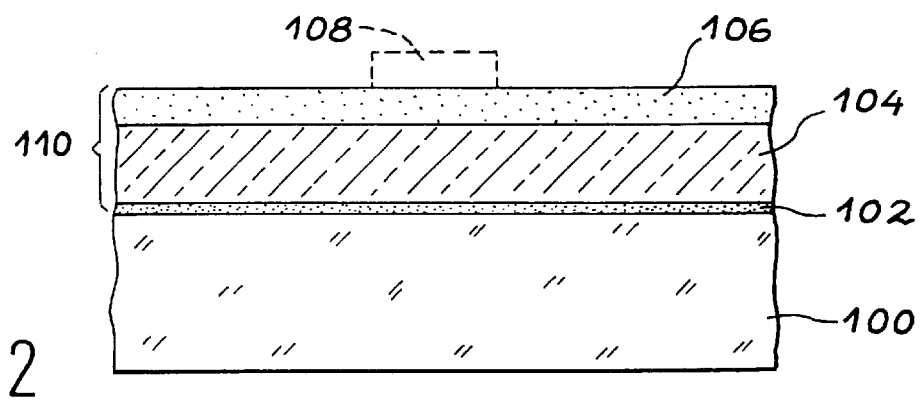
FIGS. 2 and 3 are diagrammatic sections through a transistor during manufacture in accordance with the process according to the invention. They illustrate the formation of a dummy grid and the source and drain regions.

As shown in FIG. 2 in the described example, the transistor is made on a silicon substrate 100, the surface of which has been oxidized in order to form a layer 102 of silicon oxide called the pedestal layer.

A layer of polycrystalline or amorphous silicon 104, and then a layer of silicon nitride 106 are deposited in sequence on layer 102. The assembly of these layers forms a stack 110. For example, the total thickness of layers 104 and 106 may be of the order of 100 to 500 nm, and is approximately equivalent to the thickness of the transistor grid that will be finally obtained at the end of the manufacturing process.

An etching mask 108 such as a photosensitive resin mask, shown as a dashed line, is formed on the silicon nitride layer 106. This mask defines the location, the size and the shape of a dummy grid that is to be made in stack 110.

Layers 102, 104 and 106 in stack 110 are eliminated by etching, except for a portion protected by the mask 108.

Figure 3:
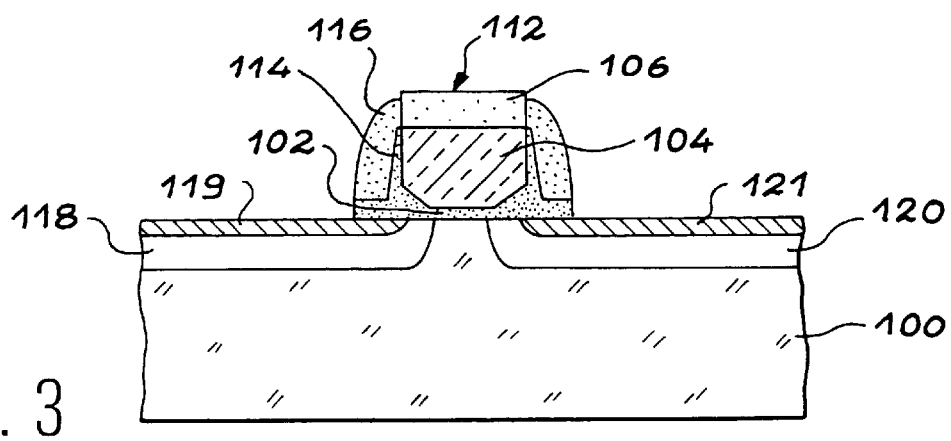

This portion of the stack forms the body of the dummy grid, identified in FIG. 3 as reference 112.

The flank(s) of the dummy grid 112, and more precisely the flanks corresponding to the polycrystalline silicon layer 104, are thermally oxidized leading to the formation of a layer called a thermal oxide layer 114 shown in FIG. 3. During this oxidation, the top of the polycrystalline silicon layer 104 is protected by the silicon nitride layer 106. Note also that the silicon oxide pedestal layer 102 dampens or limits stresses that occur during thermal oxidation of the flanks of the dummy grid.

Formation of the dummy grid is followed by a first implantation of ions at a low dose. Ions are chosen so as to make areas with a p or n type of conductivity, depending on whether the transistor to be made is of the PMOS or NMOS type. For example during the first implantation, boron ions are implanted at a dose of $10^{13}$ at $10^{14}$ cm$^{-2}$ at an energy of 3 to 25 keV for PMOSs. Phosphorus or arsenic with the same dose and energy ranges are used in the case of an NMOS transistor.

The first implantation is followed by the formation of lateral spacers 116 as shown in FIG. 3, on the flank(s) of the dummy grid.

As described above, the lateral spacers preferably made of silicon oxide doped with phosphorus, are formed by the conform deposit of a layer of this material and then anisotropic etching of this layer.

A second implantation is then made at a higher dose between a few $10^{14}$ and a few $10^{15}$ cm$^{-2}$. The dummy grid 112, widened by the lateral spacers 116, forms an implantation mask during this second implantation.

The first and second implantations thus form gradual source and drain regions on each side of the dummy grid. These regions are shown in FIG. 3 as references 118 and 120.

Source and drain regions 118 and 120 are subject to silicidation at high temperature of the order of 500° C. to 750° C. in order to improve future contact on these regions. The silicide layer formed in the source and drain regions is shown as references 119 and 121 respectively.

Figure 4:
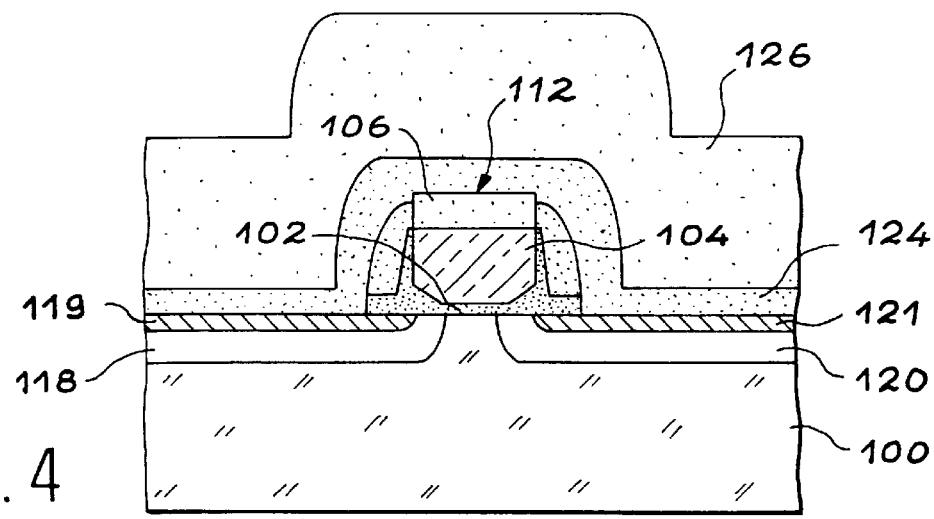
FIGS. 4 and 5 are diagrammatic sections through the transistor in FIG. 3 after the dummy grid has been coated.

When silicidation is complete, a first layer of silicon oxide doped with phosphorus 124 is deposited, followed by a second layer consisting of either intrinsic silicon oxide 126 that is not intentionally doped, or borophosphosilicate (BPSG) as shown in FIG. 4. Layers 124 and 126 coat the dummy grid 112.

Figure 5:
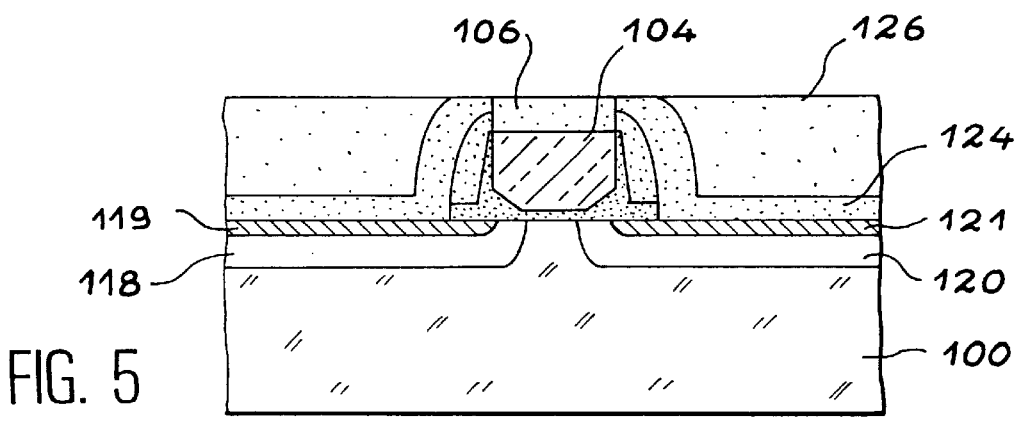

Layers 124 and 126 are polished stopping on the silicon nitride layer 106 of the dummy grid 112. As shown in FIG. 5, this operation forms a plane surface flush with the top of the dummy grid.

The thickness of the oxide layers 124 and 126, and the height of the dummy grid, is adjusted as a function of the height of the final grid to be made, and the size of the flare formed in these layers and described in the rest of this text.

The thickness 124 is chosen to be greater than or equal to the lithography positioning tolerance. The thickness 126 is chosen to be equal to or greater than the height of the dummy grid to enable good flattening.

Figure 6:
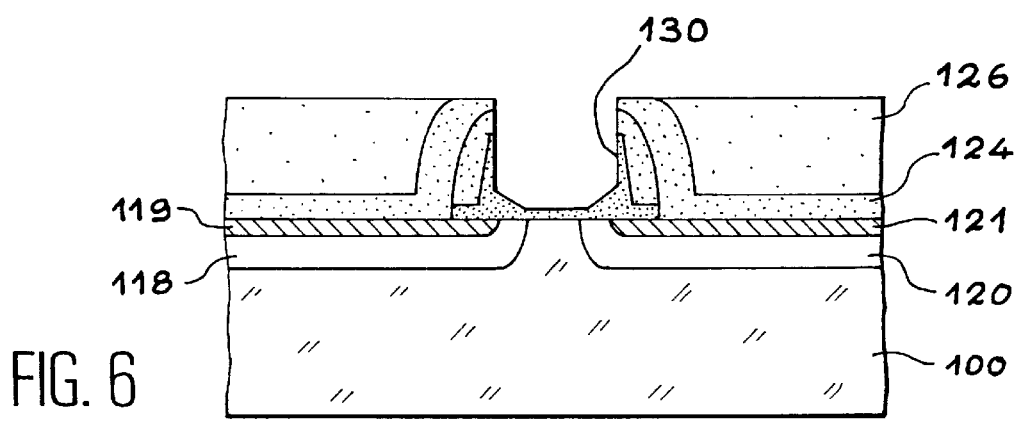
FIGS. 6 and 7 are diagrammatic sections through the transistor in FIG. 5, and in particular illustrate a step in which the dummy grid is being eliminated.

As shown in FIG. 6, the process is continued by eliminating the dummy grid. The silicon nitride layer 106 and the polycrystalline silicon layer 104 (see FIG. 5) are eliminated by etching. The pedestal layer 102 may be used as an etching stop layer during this etching.

Elimination of the dummy grid defines an opening 130, the location, dimensions and shape of which control production of the final grid.

Figure 7:
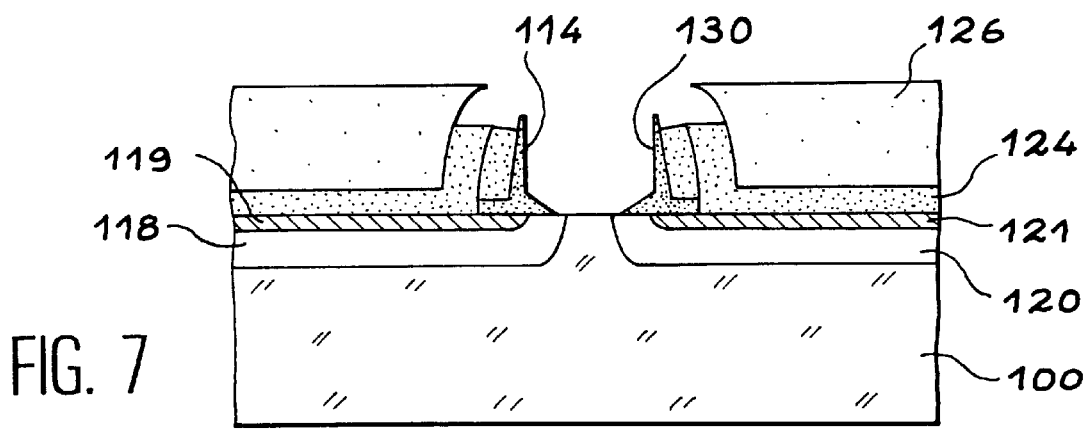

According to one advantageous aspect, the opening 130 may be flared upwards, in other words moving away from the substrate as shown in FIG. 7.

In order to flare the opening 130, the first and second oxide layers 124, 126, and the lateral spacers 116 and the thermal oxide layer 114, are partially etched. For example, this etching could be done using hydrofluoric acid.

Figure 1:
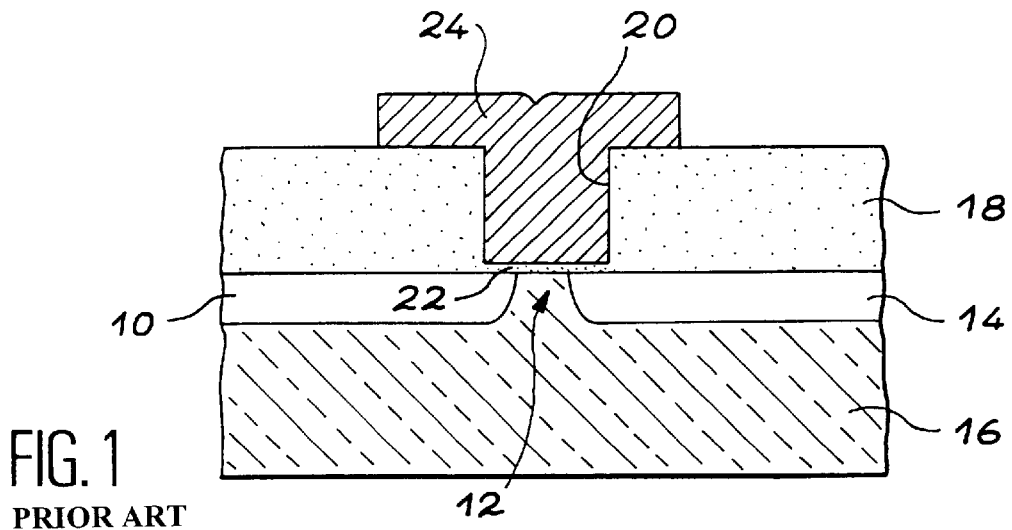
FIG. 1, described above, is a diagrammatic section through a known type of hyper-frequency MOS transistor.

Note in FIG. 1 that this etching also eliminates the residual part of the pedestal layer of the dummy grid which is now eliminated.

Due to this particular choice of materials for layers 114, 116, 124 and 126, the acid etching which takes place at a variable rate depending on the materials, produces a flared shape of opening 130 according to a particular chosen profile. It is a T-shaped profile in the case of the example described.

As an example, the etching rate of the layer of PSG lateral spacers 114 is five times greater than the thermal etching rate of the oxide and three times greater than the intrinsic etching rate of the oxide in layer 126. If the layer 126 is made of borophosphosilicate (BPSG), it is found that the PSG etching rate is six times greater than the BPSG etching rate.

Figure 8:
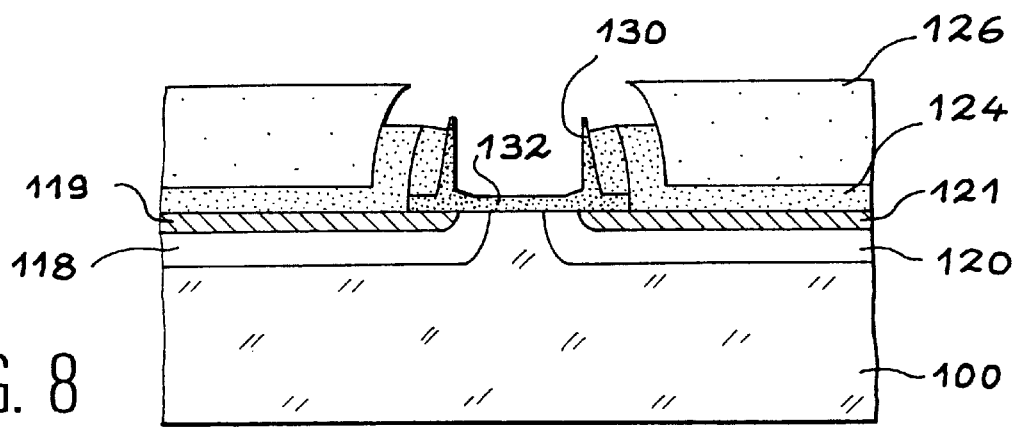
FIGS. 8 and 9 are diagrammatic sections through the device in FIG. 7 and illustrate steps in the preparation and production of a final grid.

FIG. 8 shows the placement of an insulating grid layer 132. This layer will electrically insulate the final grid, which will be made from the transistor channel. The layer 132 is advantageously a silicon oxide layer made by oxidation. Note that part of the source and drain regions has been exposed during the previous chemical etching (FIG. 7). A differential oxidation rate tends to cause stronger oxidation in these doped regions when the grid insulation layer 132 is formed.

Figure 9:
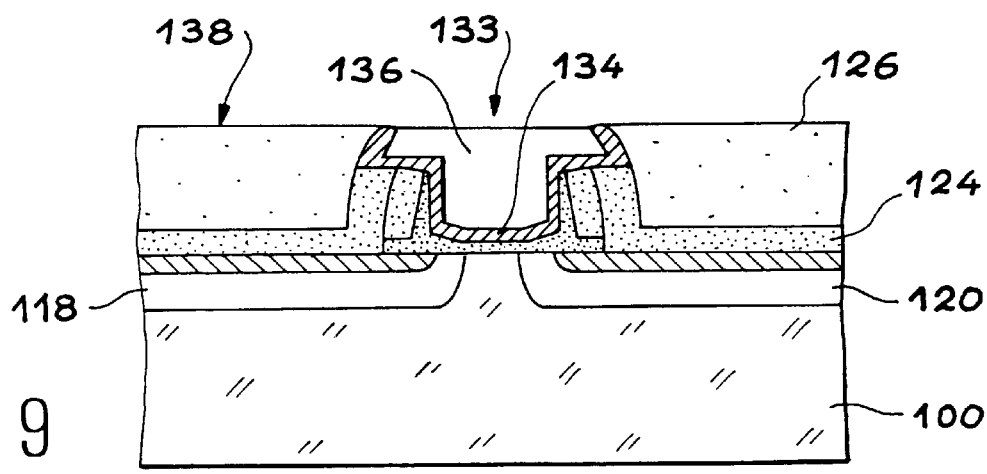

FIG. 9 shows the formation of the final grid 133. A "mid-gap" material can advantageously be chosen for making this grid, in other words a material such that its Fermi level is approximately the same as the intrinsic Fermi level of the semiconductor. For example, the "mid-gap" material may be chosen among TiN, Ti, Cu, W and Al.

In the example embodiment described, the grid 133 comprises a dual layer TiN/W in which the titanium nitride layer forms a bond layer for the tungsten. The titanium nitride layer 134 and the tungsten layer 136 are deposited using a low pressure chemical vapor deposition (LPCVD) technique, that can give a conform deposit. In another example embodiment, the TiN/W dual layer may be replaced for example by a TiN/Al dual layer.

Layers 134 and 136 are then mechanically-chemically polished or anisotropically etched, stopping on oxide layer 126. This treatment can give a smooth and plane upper surface 138. Note that a resin layer is deposited to enable flattening when an anisotropic etching procedure is used beforehand.

FIG. 9 clearly shows the flared shape of the final grid of the transistor thus obtained. The cross-section of the grid is then T-shaped. This shape has advantages for operation of the transistor and for interconnection of transistors conform with the invention to form a circuit.

In particular, the T-shape of the grid reduces the grid resistance and thus contributes to increasing the transistor cutoff frequency under hyper frequency operating conditions.

Figure 10:
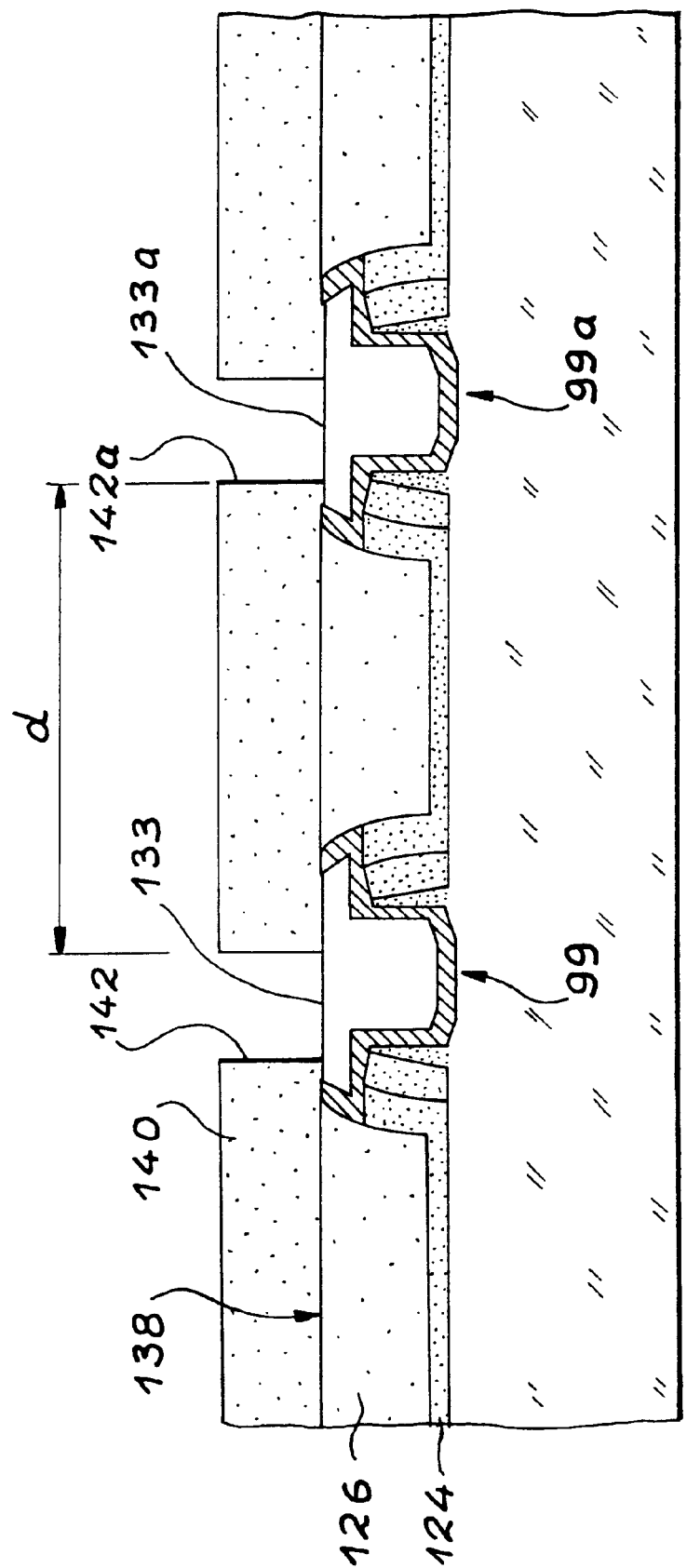
FIG. 10 is a diagrammatic section of two interconnections made in accordance with the invention at the same time as the transistors, and illustrates a step in the manufacture of grid interconnections.

FIG. 10 shows the advantages obtained by the particular shape of the grid for the interconnection.

FIG. 10 shows two metallic lines 99 and 99a made according to the invention. The metallic lines may be either transistor grids, or interconnection lines on an oxide field.

Openings 142, 142a made in an oxide layer 140 formed on the upper surface 138 of the transistors or interconnections, determine the location of contact points on metallic lines 99 and 99a. A layer of interconnection metal is subsequently deposited on the oxide layer 140 and in openings 142, 142a. This layer is then shaped to form other interconnection lines. As shown in the figure, a variable offset between the location of openings 142, 142a and grids 133, 133a is possible due to the flaring of the grids and their T-shape. The grid metal is always present under the contact point even if the clearance from interconnection lines (openings 142, 142a) is zero.

This result is particularly interesting. It means that the distance (d) between the various grid interconnection lines can be reduced, so that the integration density of circuits made with transistors according to the invention can thus be increased.

The integration density may also be increased due to the symmetry of the transistors. As explained previously, this advantage is due to the self-aligned nature of the source and drain with respect to the grid.

Finally, note in FIG. 10 that the transistor source and drain regions, and the contact points on these regions, are not shown in order to simplify the drawing and make it more general.

Figure 11:
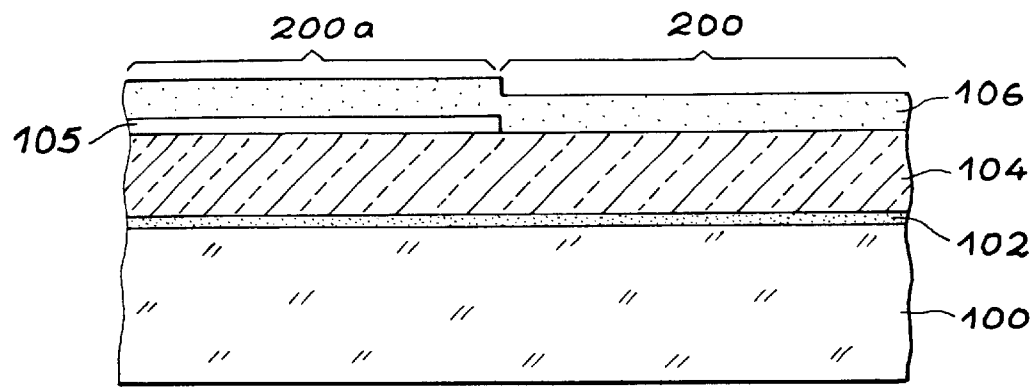
FIGS. 11 to 19 are diagrammatic sections through structures illustrating successive steps in a process for manufacturing a first transistor with a grid made of a low resistivity material and a second transistor with a silicon grid in accordance with an improvement to the invention.

FIG. 11 and subsequent figures show a variant to the process according to the invention when two types of transistors are made. Firstly, one or several transistors are made with a grid made of a material with low resistivity, for example TiN/W as described previously, and secondly one or several transistors with a silicon grid are made. For simplification reasons, the figures only show the production of a single transistor of each type.

As shown in FIG. 11, the starting point is a structure comprising a silicon substrate 100, a pedestal layer 102 made of silicon oxide, an amorphous or polycrystalline silicon layer 104, and a silicon nitride layer 106. Refer to FIG. 2 and the corresponding description for further information about this subject.

The structure comprises two regions referred to as the first region and second region respectively, and identified by references 200 and 200a. In FIG. 11, it can be seen that a silicon oxide layer 105 is inserted between the polycrystalline or amorphous silicon layer 104 and the silicon nitride layer 106, in the second region 200a.

Preferably, before the silicon nitride layer 106 is formed, the free surface of the silicon layer 104 may be oxidized to form an oxide layer over its entire surface. The oxide layer is then eliminated by wet etching in region 200 before the silicon nitride layer 106 is formed. In this respect, note that a structure with several regions equivalent to the first region 200, and several regions equivalent to the second region, can be formed.

Figure 12:
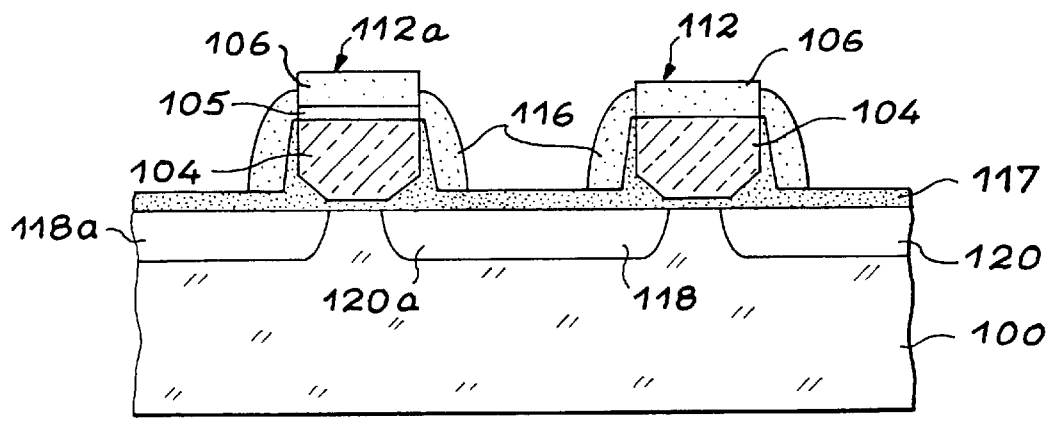

As shown in FIG. 12, a dummy grid 112 is then made in the first region 200, and a grid 112a referred to simply as the "silicon grid", is formed in the second region 200a in the structure shown in FIG. 11.

The dummy grid 112 in FIG. 12 is identical to the dummy grid 112 in FIG. 3. The silicon grid 112a is different simply due to the additional silicon oxide layer 105 between the silicon layer 104 and the silicon nitride layer 106.

Grids 112 and 112a have flanks on which a layer of thermal oxide 114 and lateral spacers 116 are formed. Grids 112, 112a in the thermal oxide layer 114 and spacers 116 are formed using processes identical to those described in the discussion on the formation of the grid 112, layer 114 and spacers 116 in FIG. 3. Therefore, refer to the previous description for further information on this subject. When spacers have been completely etched, the pedestal oxide is eliminated from the source and drain regions. A re-oxidization is then carried out before the high dose implantation step ($n^+$, $p^+$) to form a layer 117 called the "re-oxidization" layer.

For example, it may be noted that the grids 112 and 112a are formed simultaneously in two etching steps.

A first etching of the silicon nitride and oxide layers is selective with respect to the silicon, and takes place stopping in the polycrystalline or amorphous silicon layer 104.

A second silicon etching 104 is then done, this second etching being selective with respect to the silicon oxide.

FIG. 12 also shows the formation of source and drain regions 118a, 120a, 118, 120 on each side of grids 112a and 112. In this respect, refer also to the previous description. Note also that the source and drain regions 120a and 118 form a single doped region common to the two transistors.

Figure 13:
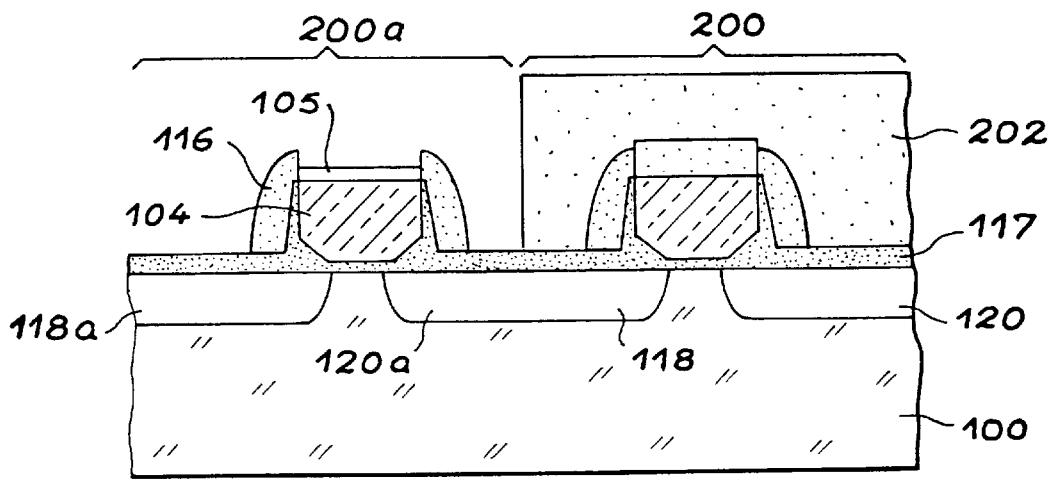

In a subsequent step illustrated in FIG. 13, the silicon nitride layer in the silicon grid 112a is eliminated by etching, stopping on the silicon oxide layer 105. During this etching, the substrate is protected by the re-oxidation layer 117. After this operation, doping impurities may be implanted in the layer 104 of the silicon grid 112a. For example, this implantation may take place if the grid material had not been doped beforehand, when it was deposited. Furthermore, the entire first region 200 is protected by a resin layer 202. The resin layer protects the entire region 202 and the dummy grid from treatments carried out in the second region 200a.

After the resin layer 202 has been eliminated, etching is carried out to eliminate the re-oxidization layer 117 and the layer 105 of the silicon grid 112a.

Figure 14:
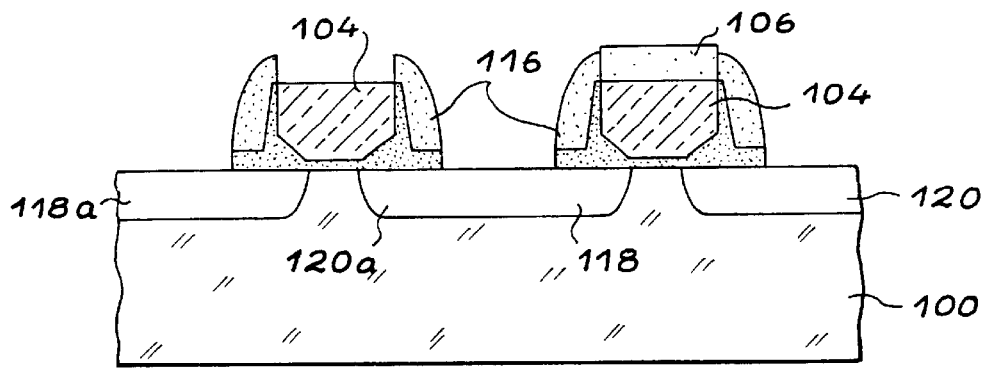

As shown in FIG. 14, this operation can expose the substrate in the source and drain regions, and expose the polycrystalline silicon layer 104 of grid 112a.

Figure 15:
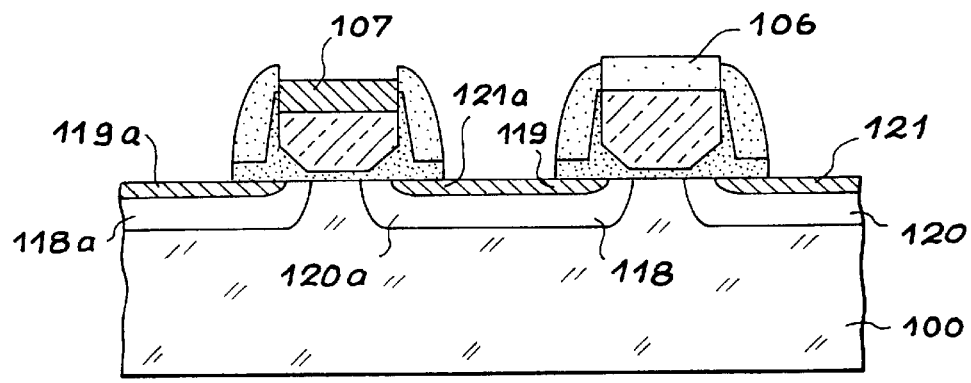

Silicidation of the exposed silicon forms silicided areas 119a, 121a, 119, 121 on the source and drain regions 118a, 120a, 118, 120. A silicide layer 107 is also formed on the silicon layer 104 of the silicon grid 112a, as shown in FIG. 15.

Figure 16:
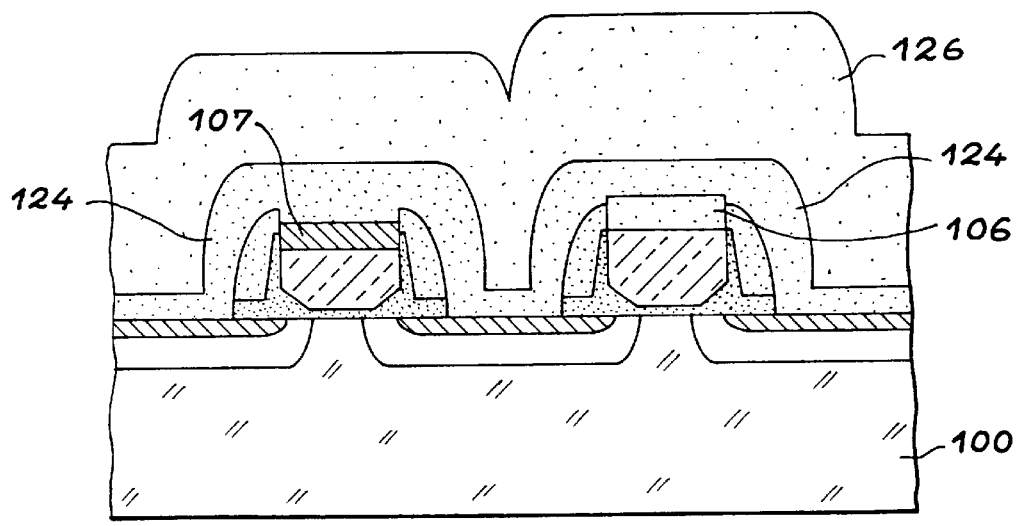

The process continues by the conform deposit of a sequence of a first layer 124 of silicon oxide doped with phosphorus, then a second layer 126 of intrinsic silicon oxide that is not intentionally doped, or borophosphosilicate (BPSG). Layers 124 and 126 coat the dummy grid 112 and the silicon grid 112a as shown in FIG. 16.

Figure 17:
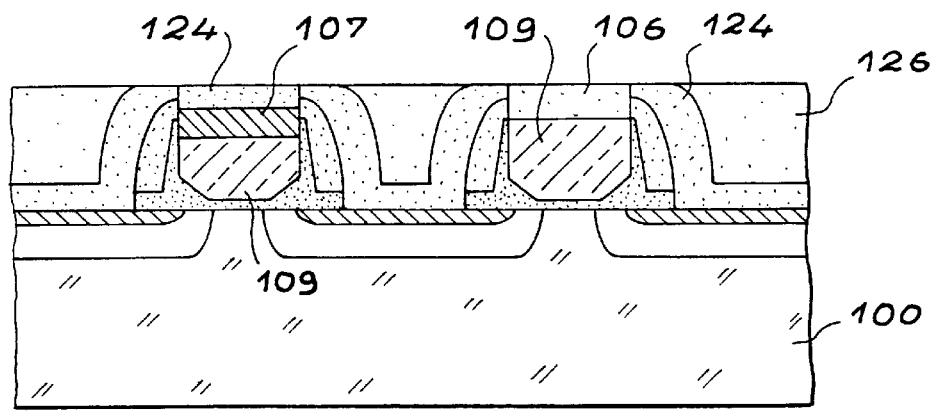

A flattening polishing stopping on the silicon nitride layer 106 of the dummy grid results in the structure shown in FIG. 17. Note that part of the oxide grid 124 is protected on the silicon grid 112a during this polishing step.

Deposition operations of the oxide layers 124 and 126, and polishing, are similar to the operations illustrated in FIGS. 4 and 5. Therefore, refer to the corresponding description for FIGS. 4 and 5 for further information about this subject.

The next operation consists of eliminating the dummy grid 112. The part of the oxide layer 124 preserved on the silicided silicon grid 112a protects it during etching of the silicon nitride layer 106 and the silicon layer 104 of the dummy grid.

After eliminating the silicon nitride and silicon layers from the dummy grid, de-oxidation can also eliminate the pedestal oxide layer 102 thus exposed. An opening 130 is thus obtained. During this de-oxidization, the part of the oxide layer 124 preserved on the silicon grid may be partly eliminated.

Figure 18:
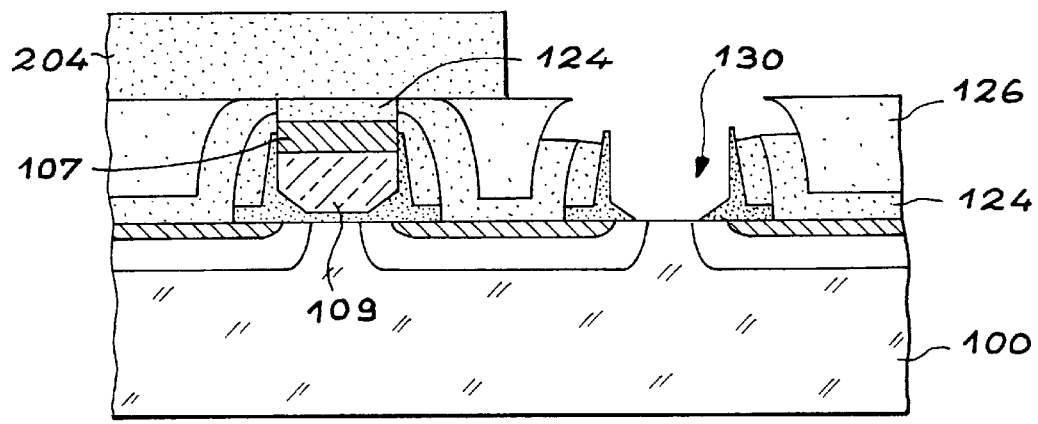

Thus, as shown in FIG. 18, a resin mask 204 may be provided to protect the silicon grid by covering and protecting the entire second region 200a during operations to eliminate the dummy grid.

The next operation is to produce a final grid 133 in the opening 130, possibly after flaring the opening 130.

This operation is identical to the operation described with reference to FIGS. 7 to 9. Refer to the corresponding description, which is not repeated here.

Figure 19:
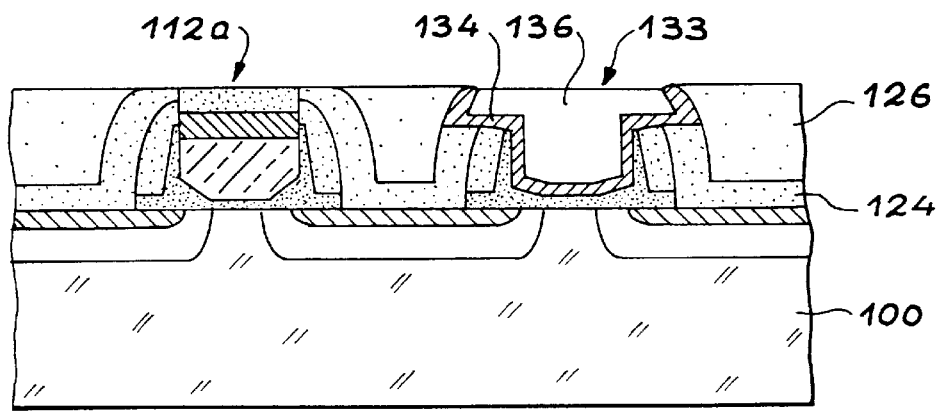

The result, as shown in FIG. 19, is that silicided silicon grids 112a with an approximately rectangular cross-section, and grids 133 made of a material with low resistivity, for example flared shape metallic grids, are obtained on the same substrates as shown in FIG. 19.

We will now describe a variant embodiment of the process according to the invention. This description is applicable to the production of a single metallic grid transistor.

The first steps in the process are identical to the steps illustrated in FIGS. 1 to 3, which should be referred to.

A thin layer of a silicon nitride 123 is deposited on the structure, after completing silicidation which consists of forming silicide layers 119 and 121 of the source and drain regions.

Figure 20:
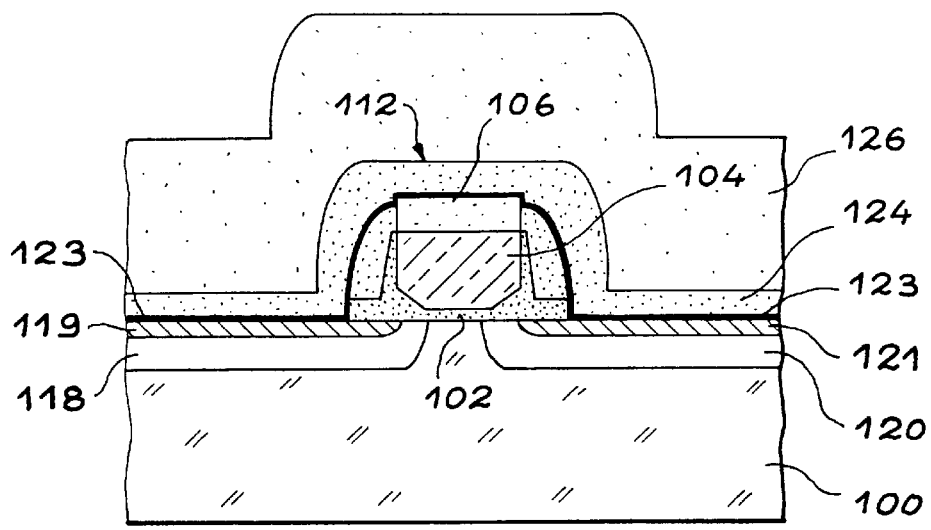
FIGS. 20 to 23 are diagrammatic sections through a transistor with a grid made of a material with a low resistivity during manufacturing according to a variant of the process according to the invention.

The layer of silicon nitride 123 is deposited before the first and second layers of silicon oxide (or BPSG) 124 and 126 are formed, to obtain the structure illustrated in FIG. 20.

Note that the silicon nitride layer 123 covers the silicide layers 119 and 121 formed on the source and drain regions 118, 120, the lateral spacers 116 and the silicon nitride layer 106 at the top of the dummy grid 112.

Figure 21:
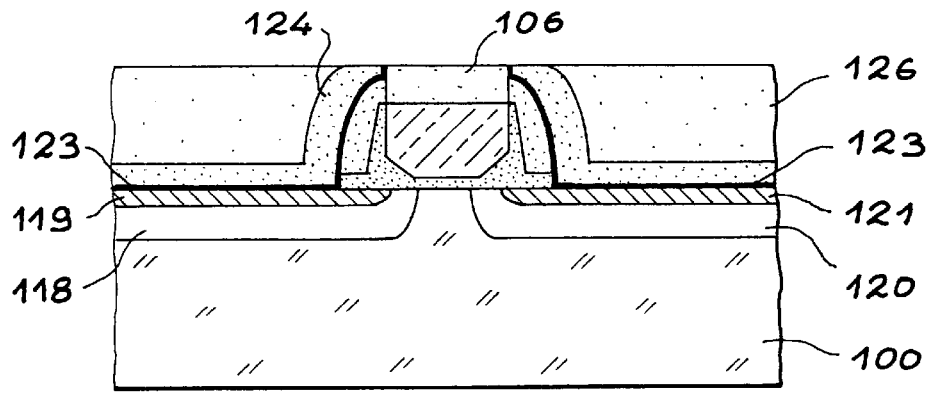

The structure illustrated in FIG. 21 is obtained by polishing the first and second oxide layers (and the BSPSG layer) 124 and 126, stopping on the silicon nitride layer 102.

This figure shows that the silicon nitride layer 123 may be partly etched above the silicon nitride layer 106.

Figure 22:
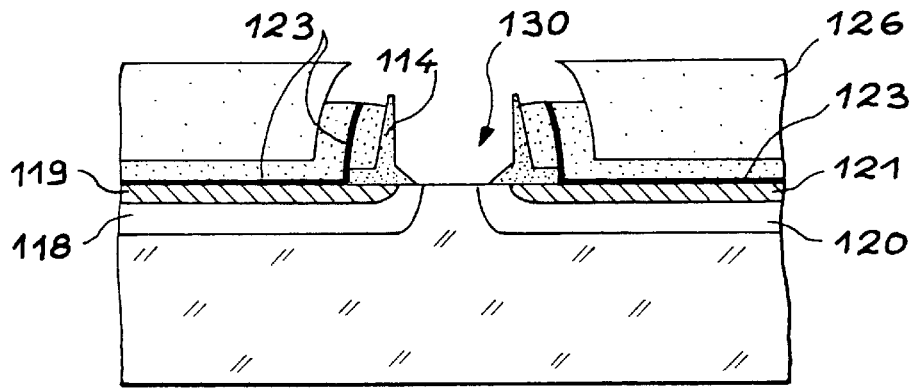

FIG. 22 shows elimination of the dummy grid and the formation of an opening 130 with a flared shape. These operations are described in more detail with reference to FIGS. 6 to 8. Note that a part of the silicon nitride layer remains above the source and drain regions and between the remaining parts of the lateral spacers 116 and the first oxide layer 124.

Figure 23:
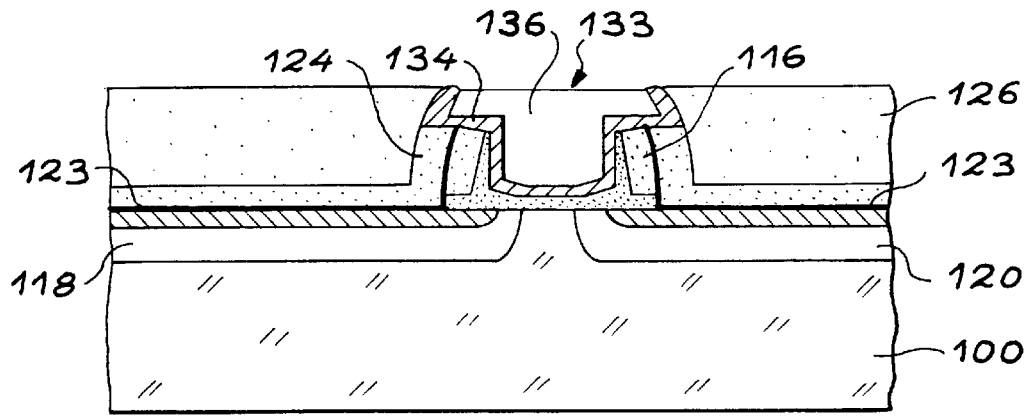

FIG. 23 shows the production of a final grid 133. This is a dual layer grid of the type described with reference to FIG. 9.

Note that finally, throughout the described process, the silicon nitride layer 123 protects the silicide layers 119 and 121 in the source and drain regions. This protection prevents partial oxidation of these regions during the process and thus guarantees excellent source and drain contact points.

The improvement described above is also applicable to the process leading to the concurrent production of silicon grids and metallic grids (low resistivity material).

In this case, the formation of the silicon nitride layer 123 also takes place after the formation of silicide layers 119, 121, 119a, 121a illustrated in FIG. 15, and before formation of the oxide layers 124 and 126 illustrated in FIG. 16.

Figure 24:
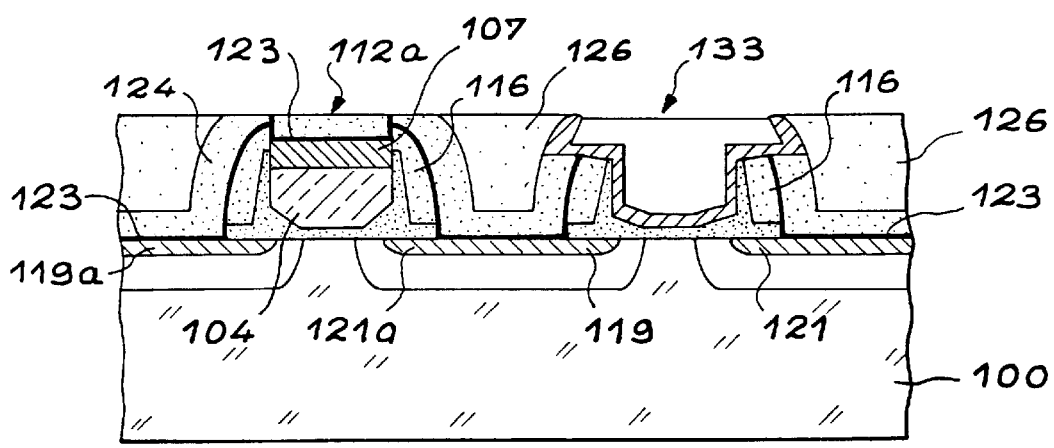
FIG. 24 is a diagrammatic section through a transistor with a grid made of low resistivity material and a transistor with a silicon grid made according to the variant of the process according to the invention.

Finally, the structure illustrated in FIG. 24 is obtained at the end of the process.

As shown on this figure, the silicon nitride layer covers the silicon layers 119a, 121a, 119, 121 and extends between lateral spacers 116 and the oxide layer 124, over the flanks of the silicon grid 112a and the final grid 133. The silicon nitride layer 123 is also located in the silicon grid 112 obtained at the end of the process between the silicide layer 107 and the part of the oxide layer 124 preserved on the silicon grid 112 during polishing of layers 124 and 126.

Referenced Document (1)

"A Newly Developed Two Mode Channel FET (TMT) Suited for Super-Low-Noise and High-Power Applications", Minoru Sawada, Daijiro Inoue, Kohji Matsumura, and Yasoo Harada, Extended Abstracts of the 1993 International Conference on Solid State Devices and Materials, Makuhari, 1993, pp. 1083–1085.

What is claimed is:

1. A process for manufacturing at least one MIS transistor with a low resistivity grid on a semiconductor substrate, comprising the steps of:

producing a dummy grid on the substrate, the dummy grid comprising at least one material capable of resisting heat treatment;

forming self-aligned source and drain regions in the substrate;

depositing a first electrically insulating layer of silicon oxide doped with phosphorus and then a second electrically insulating layer of borophosphosilicate or silicon oxide that is not intentionally doped, the first and second electrically insulating layers coating the dummy grid;

polishing the first and second electrically insulating layers stopping on the dummy grid;

eliminating the dummy grid to define an opening;

partially etching the first and second electrically insulating layers to flare the opening; and forming in the opening a final grid including at least one material with low resistivity and separated from the substrate by a grid insulation layer.

2. The process according to claim 1, wherein the producing step comprises the steps of:

forming on the substrate a stack comprising a silicon oxide pedestal layer, a polycrystalline or amorphous silicon layer, and a first silicon nitride layer in this order; and etching the stack to form the dummy grid with lateral flanks.

3. The process according to claim 2, further comprising the step of thermally oxidizing a surface of the polycrystalline or amorphous silicon layer flush with the lateral flanks of the dummy grid.

4. The process according to claim 1, wherein the produced dummy grid has lateral flanks, and wherein the step of forming the self-aligned source and drain regions comprises the steps of:

performing a first implantation of a low dose of doping impurities using the dummy grid as an implantation mask;

forming lateral spacers on lateral flanks of the dummy grid; and performing a second implantation of doping impurities with a dose higher than the dose of the first implantation, using the dummy grid equipped with the lateral spacers as the implantation mask.

5. The process according to claim 4, wherein the step of forming the lateral spacers comprises the steps of:

depositing a layer of silicon oxide doped with phosphorus in order to coat the dummy grid; and anisotropically etching the layer of silicon oxide doped with phosphorus to eliminate a part of the layer of silicon oxide doped with phosphorus above the dummy grid while preserving another part of the layer of silicon oxide doped with phosphorus on the lateral flanks of the dummy grid, the another part forming the lateral spacers.

6. The process according to claim 4, wherein the step of forming the self-aligned source and drain regions further comprises the step of performing self-aligned silicidation of the source and drain regions.

7. The process according to claim 6, wherein a silicon nitride layer is deposited on the source and drain regions after the self-aligned silicidation.

8. The process according to claim 2, wherein the step of eliminating the dummy grid comprises the steps of:

eliminating by etching the first silicon nitride layer and the polycrystalline or amorphous silicon layer in the dummy grid; and using the silicon oxide pedestal layer as an etching stop layer during the eliminating by etching step.

9. The process according to claim 2, wherein the partially etching step comprises the step of eliminating the silicon oxide pedestal layer by etching.

10. The process according to claim 4, wherein the partially etching step comprises the step of partially eliminating the lateral spacers of the dummy grid.

11. The process according to claim 1, wherein the step of forming the final grid comprises the steps of:

successively depositing a titanium nitride layer and a tungsten layer to conform to the opening; and then flattening the titanium nitride and tungsten layers stopping on the second electrically insulating layer.

12. The process according to claim 11, wherein the titanium nitride layer and the tungsten layer are formed by a low pressure chemical vapor deposition.

13. The process according to claim 11, wherein the flattening step takes place through one of a mechanical/chemical polishing operation and an anisotropic etching.

14. The process according to claim 1, wherein the step of forming the final grid is preceded by the step of forming the grid insulation layer to electrically insulate the final grid from the substrate.

15. The process according to claim 1, further comprising the step of:

forming a channel region in the substrate before the producing step by doping the substrate, the dummy grid being formed above the channel region.

16. The process according to claim 1, further comprising the steps, performed after the step of forming the final grid, of:

forming contact points in the source and drain regions and on the final grid; and performing metallization of the contact points.

17. The process according to claim 2, further comprising the step of forming at least one transistor with a silicon grid.

18. The process according to claim 17, the producing step including, forming the stack as a first stack on the substrate in at least a first region, and forming a second stack on the substrate in at least a second region, the second stack comprising the silicon oxide pedestal layer, the polycrystalline or amorphous silicon layer, a silicon oxide intermediate layer, and the first silicon nitride layer, and shaping the first and second stacks by etching to produce the dummy grid with the lateral flanks in the first region and the silicon grid in the second region;

wherein the step of forming the self-aligned source and drain regions includes forming the source and drain regions self-aligned on the dummy grid and the silicon grid, respectively, in the substrate;

wherein the depositing step includes, laterally coating the dummy grid and the silicon grid with at least one of the first and second electrically insulating layers;

wherein the depositing step is preceded by the steps of, eliminating the first silicon nitride layer on the silicon grid in the second region, eliminating the silicon oxide pedestal layer around the dummy grid and the silicon grid, and eliminating the silicon oxide intermediate layer; and wherein the step of eliminating the dummy grid includes forming a protection layer covering the silicon grid in the second region.

19. The process according to claim 18, further comprising the step of performing self-aligned silicidation of the source and drain regions and the polycrystalline or amorphous silicon layer in the silicon grid after the steps of eliminating the silicon oxide pedestal layer and the silicon oxide intermediate layer and before the depositing step.

20. The process according to claim 18 further comprising the step of implanting doping impurities in the polycrystalline or amorphous silicon layer of the silicon grid after the step of eliminating the first silicon nitride layer on the silicon grid in the second region.

21. The process according to claim 18, wherein the step of laterally coating the dummy grid and the silicon grid comprises the steps of:

depositing the first electrically insulating layer of silicon oxide doped with phosphorus and then the second electrically insulating layer of borophosphosilicate or silicon oxide that is not intentionally doped, the first and second electrically insulating layers coating the dummy grid and the silicon grid; and polishing the first and second electrically insulating layers stopping on the dummy grid, a thin layer of the first electrically insulating layer being preserved on the polycrystalline or amorphous silicon layer of the silicon grid while the polishing is being done.

22. The process according to claim 19, wherein a second silicon nitride layer is formed on the source and drain regions and on the polycrystalline or amorphous silicon layer of the silicon grid after the self-aligned silicidation.

* * * * *